(12) United States Patent
Salama

(10) Patent No.: US 7,237,334 B2
(45) Date of Patent: Jul. 3, 2007

(54) METHOD OF PROVIDING A PRINTED CIRCUIT BOARD USING LASER ASSISTED METALLIZATION AND PATTERNING OF A MICROELECTRONIC SUBSTRATE

(75) Inventor: Islam A. Salama, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 28 days.

(21) Appl. No.: 11/207,330

(22) Filed: Aug. 18, 2005

(65) Prior Publication Data

US 2007/0039754 A1     Feb. 22, 2007

(51) Int. Cl.
*H01R 3/10*     (2006.01)

(52) U.S. Cl. ............... 29/852; 29/846; 219/121.18; 219/121.19

(58) Field of Classification Search ............ 29/846, 29/852; 219/121.18, 121.19
See application file for complete search history.

(56) References Cited

U.S. PATENT DOCUMENTS

| | | | | |
|---|---|---|---|---|
| 5,233,133 A | * | 8/1993 | Iwasaki et al. | 174/250 |
| 2001/0029065 A1 | * | 10/2001 | Fischer et al. | 438/115 |
| 2001/0036721 A1 | * | 11/2001 | Dallner et al. | 438/618 |
| 2004/0134682 A1 | * | 7/2004 | En et al. | 174/258 |

\* cited by examiner

*Primary Examiner*—Carl J. Arbes
(74) *Attorney, Agent, or Firm*—Laleh Jalali

(57) ABSTRACT

A method of providing a printed circuit board, a printed circuit board formed according to the method, and a system comprising the printed circuit board. The method comprises: providing a microelectronic substrate; providing a via-defining substrate by providing via openings in the substrate using laser irradiation; providing a laser activatable film on the via-defining substrate; and providing interconnects on the via-defining substrate. Providing interconnects comprises providing a patterned build-up layer on the via-defining substrate comprising exposing the laser activatable film to laser irradiation to selectively activate portions of the film according to a predetermined interconnect pattern; and metallizing the patterned build-up layer according to the predetermined interconnect pattern to yield the interconnects to provide the printed circuit board.

15 Claims, 3 Drawing Sheets

Fig. 1
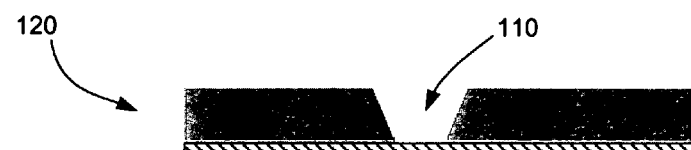
Fig. 2
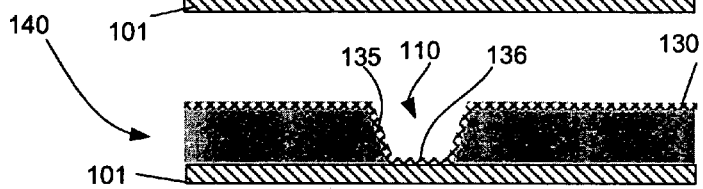
Fig. 3
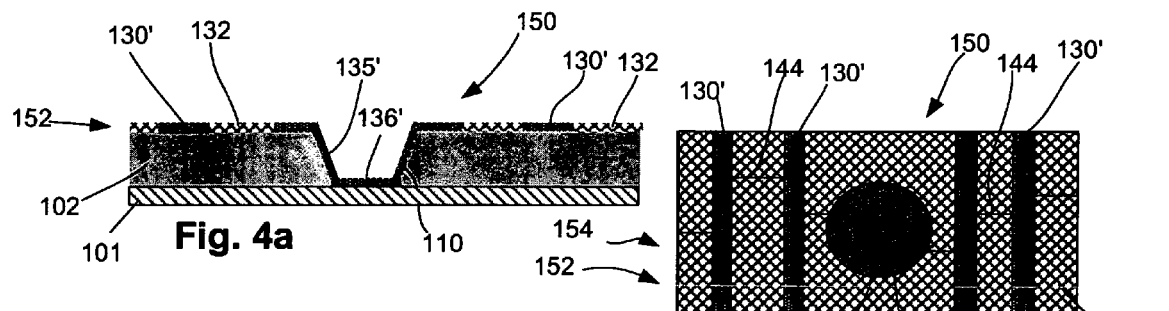
Fig. 4a  Fig. 4b
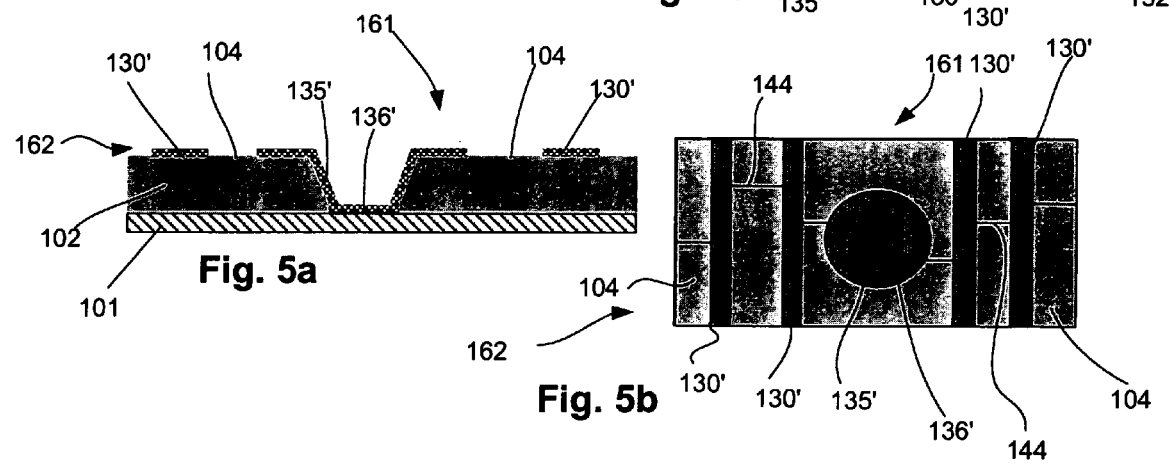
Fig. 5a  Fig. 5b

METHOD OF PROVIDING A PRINTED CIRCUIT BOARD USING LASER ASSISTED METALLIZATION AND PATTERNING OF A MICROELECTRONIC SUBSTRATE

FIELD

Embodiments of the present invention relate to the field of electronic fabrication, and more specifically, to laser patterning of microelectronic substrates to obtain printed circuit boards, and to high/low density interconnects for microelectronic packaging applications.

BACKGROUND

The state of the art provides numerous techniques for manufacturing a printed circuit board. The starting material is a microelectronic substrate, typically a dielectric board such as, for example, an ABF (Ajinomoto Build-up Film) layer, which may then be processed according to one of the numerous techniques mentioned above to provide the printed circuit.

One such technique involves providing the dielectric layer, and then laser drilling via openings into the dielectric layer. Thereafter, the dielectric layer is roughened, subjected to chemical copper plating, such as electroless plating, to provide a thin layer of copper over the entire dielectric layer including on the walls of the via openings. A dry-film resist, or DFR, is then laminated onto the thin layer of copper, and the DFR thereafter subjected to an expose and develop process to form the circuit design pattern in accordance with the requirements of the circuit specifications. After subjecting the DFR to a developing solution in order to wash away exposed areas of the same, the combination of the dielectric layer-thin copper layer-patterned DFR is subjected to electrolytic copper plating in order to provide a copper layer (hereinafter "thick copper layer") much thicker than the thin copper layer mentioned above both on regions of the thin copper layer not covered by the patterned DFR (in order to provide conductive traces on the dielectric layer), and, in addition, inside the via openings. Thus, after further plating of the thick copper layer to protect the same from etching, the patterned DFR is stripped from the combination to expose the thin copper layer not covered by the thick copper layer. The thus bare thin copper layer is now completely etched away down to the dielectric layer leaving a printed circuit board.

Another conventional technique for providing printed circuit boards involves the provision of a dielectric layer, such as an ABF layer, followed by a laser drilling process for providing via openings in the ABF layer. Thereafter, a DFR is laminated onto the dielectric layer, and the DFR thereafter subjected to an expose and develop process to form the circuit design pattern in accordance with the requirements of the circuit specifications. After subjecting the DFR to a developing solution in order to wash away exposed areas of the same, the combination of the dielectric layer-thin copper layer-patterned DFR is subjected to an etching process in order to ablate a predetermined thickness of the dielectric layer that remains uncovered by the patterned DFR, thus providing recesses within the dielectric layer corresponding to a location of the conductive traces to be provided on the dielectric layer. The patterned DFR is then stripped from the dielectric layer. Thereafter, the dielectric layer is subjected to electroless copper plating to provide a thin layer of copper over the entire dielectric layer including on the walls of the via openings and inside the recesses provided at the location of the traces. A thicker layer of copper is then provided onto the thin copper layer by way of electrolytic plating, and the thus formed combination subjected to either back etching, grinding or CMP in order to result in a printed circuit board.

Another known technique for providing interconnects according to the prior art is typically referred to as "Laser Embedded Technology," or LET. In LET, laser ablation is used to provide via openings in a dielectric layer, such as an ABF layer. Thereafter, locations for the traces are ablated also using laser irradiation to provide recessed trace locations on the dielectric layer. Thereafter, electroless plating, and, thereafter, electrolytic plating with copper are provided on the thus ablated dielectric layer. Copper plating as described above results in the formation of a copper layer on the active surface of the dielectric layer, the copper layer filling the recessed trace locations and extending above the same. Thereafer, a process such as chemical mechanical polishing is used to remove the excess copper of the copper layer extending beyond the recessed trace locations, in this way resulting in the interconnects on the active surface of the dielectric layer.

However, disadvantageously, techniques of the prior art such as those described above, exhibit low throughput due to increased processing time, and, in addition, are ineffective for meeting current alignment budgets among others because they require the use of multiple processes for generating the vias and traces, which processes lead to a compounding of possible alignment errors.

BRIEF DESCRIPTION OF THE DRAWINGS

Embodiments of the invention are illustrated by way of example and not by way of limitation in the figures of the accompanying drawings, in which the like references indicate similar elements and in which:

FIG. 1 is a cross sectional view of a microelectronic substrate, or panel;

FIG. 2 is a cross sectional view showing the substrate of FIG. 1 as having been provided with a via opening therein to yield a via-defining substrate according to an embodiment;

FIG. 3 is a cross sectional view showing the substrate of FIG. 2 has having been provided with a laser activatable laser activatable film thereon to yield a film-substrate combination according to an embodiment;

FIGS. 4a and 4b are, respectively, cross sectional and top plan views showing the film in the combination of FIG. 3 as having been exposed to laser irradiation to selectively activate portions of the film based on a predetermined interconnect pattern to yield a selectively-activated-film-substrate combination according to an embodiment;

FIGS. 5a and 5b are, respectively, cross sectional and top plan views showing the combination of FIGS. 4a an 4b as having had non-activated portions of the film removed therefrom to yield a patterned f-build-up-layer-substrate combination according to an embodiment;

DETAILED DESCRIPTION

Figure 6A:
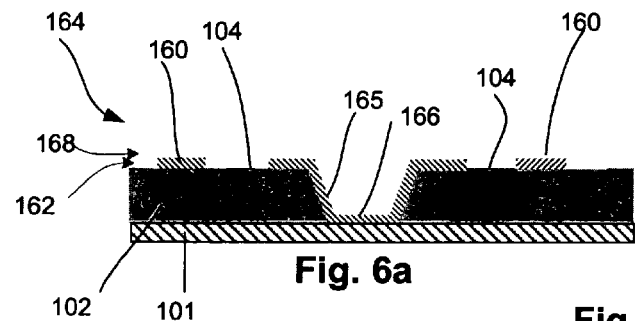
FIGS. 6a and 6b are, respectively, cross sectional and top plan views showing the combination of FIGS. 5a an 5b as having been provided with a conformal electrolessly deposited first conductive layer to yield an electrolessly plated substrate according to an embodiment.

A method for providing a printed circuit board, a printed circuit board formed according to the method, and a system comprising the printed circuit board.

Various aspects of the illustrative embodiments will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative embodiments. However, it will be apparent to one skilled in the art that the present invention may be practiced without the specific details. In other instances, well-known features are omitted or simplified in order not to obscure the illustrative embodiments.

Various operations will be described as multiple discrete operations, in turn, in a manner that is most helpful in understanding the present invention, however, the order of description should not be construed as to imply that these operations are necessarily order dependent. In particular, these operations need not be performed in the order of presentation.

The phrase "in one embodiment" is used repeatedly. The phrase generally does not refer to the same embodiment, however, it may. The terms "comprising", "having" and "including" are synonymous, unless the context dictates otherwise. It is further noted that, in the instant description, the following words are used interchangeably: (1) "substrate" and "panel;" (2) "patterned substrate," "printed circuit board," and "electronic substrate;" (3) "layer" and "film;" (4) "machining" and "drilling;" and (5) "projection" and "patterning." In addition, it is noted that, by "layer" or "film" the instant description is not necessarily referring to a continuous "layer" or "film," and further that, according to the instant description, "layer" or "film" may possibly refer to either a continuous, a discontinuous or a patterned layer or film.

Referring now to FIG. 1 by way of example, embodiments of the present invention comprise providing a microelectronic substrate or panel, such as substrate 100, provided on a conductive layer 101. The substrate may include a non-conductive material, such as plastic or fiberglass, such as ABF, or any other dielectric suitable to serve as a substrate for a printed circuit board. Conductive layer 101 may, by way of example, comprise copper, and may further represent a conductive trace on an underlying substrate (not shown).

As seen in FIG. 2 by way of example, embodiments of the present invention comprise providing via openings such as opening 110, in the substrate, such as substrate 100, to provide a via-defining substrate, such as substrate 120. According to a preferred embodiment, the via openings such as opening 110 may be provided using laser drilling or laser projection machining, such as high intensity laser drilling as is well known in the art. However, the via openings such as opening 110 may be provided according to any one of well known methods as would be readily recognizable by one skilled in the art.

Referring thereafter to FIG. 3 by way of example, embodiments of the present invention comprise providing a laser activatable film, such as, for example, film 130, comprising a laser activatable material on the via-defining substrate. According to an embodiment, the laser activatable film may have a thickness in the submicron range up to about between about 3 to about 5 microns. By "laser activatable material," what is meant in the context of the instant description is a material that is adapted to be activated when exposed to laser irradiation to provide a build up layer for a conductive material, such as, for example, copper. By "build-up layer," what is meant in the context of the present invention is a seed layer, that is, a layer adapted to allow selective provision of a conductive material thereon according to its pattern. According to a one embodiment, the laser activatable material may comprise palladium acetate or $(CH_3CO_2)_2Pd$. According to an embodiment, provision of the laser activatable film, such as film 130 shown in FIG. 3, may be effected by dip coating via-defining substrate 120 in a laser-activatable material seeding solution, such as, for example, a palladium acetate seeding solution. Other methods for providing the laser activatable film according to embodiments, include, by way of example, sputtering and chemical or physical vapor deposition. As seen in FIG. 3, the laser activatable film, such as film 130, covers an active surface of the via-defining substrate, such as substrate 120, and includes via portions, such as portions 135 and 136, which respectively cover the walls and the bottom of the via opening, such as via opening 110, respectively. By "active surface," what is meant in the context of the present invention is a surface of the substrate adapted to be provided with interconnects, such as vias and traces, according to an interconnect pattern. Provision of the laser activatable film on the active surface of the via-defining substrate yields a film-substrate combination, such as film-substrate combination 140 of FIG. 3.

Referring next to FIGS. 4a-8 by way of example, embodiments of the present invention comprise providing interconnects according to a predetermined interconnect pattern on the via-defining substrate using laser assisted metallization. Laser assisted metallization will be explained in further detail below with respect to the embodiment of FIGS. 4a-8.

Referring first to FIGS. 4a-4b by way of example, laser assisted metallization according to embodiments comprises exposing the laser-activatable material of the laser activatable film to laser irradiation to selectively activate portions of the laser activatable film according to the predetermined interconnect pattern, and, optionally, to a predetermined tie bar pattern, to yield a selectively-activated-film-substrate combination, or SATFP combination, such as combination 150 of FIGS. 4a and 4b. By "predetermined interconnect pattern," what is meant in the context of the instant description is a pattern corresponding to the predetermined interconnect traces and/or vias to be provided on the active surface of the substrate. By "predetermined tie-bar pattern," what is meant in the context of the instant description is a pattern corresponding to the predetermined tie bars to be provided on the active surface of the substrate. Thus, as seen in the embodiment of FIGS. 4a and 4b, the SATFP combination 150 may comprise a substrate portion 102 formed from substrate 100 of FIG. 1 as described above, and, in addition, a film 152 covering substrate portion 102 and defining a pattern 154, as best seen in FIG. 4b. The pattern 154 corresponding to film 152 is defined by laser activated portions 130', 135', and 136', of film 152, by non-activated portions 130', of film 152, and by laser activated tie bar regions 144 as will be described in greater detail below. The laser activated portions may include a material adapted to provide a build up layer for further conductive material to be selectively provided thereon. For example, the laser activated portions may include a graphite rich conductive seeding material. According to a an embodiment, when the laser activatable film comprises palladium acetate, the laser activated portions of the film comprise a palladium-seeded build-up layer including a palladium rich modified organic material build-up surface. In particular, laser activation of a palladium acetate material selectively ablates the acetates in the material, leaving behind the palladium rich modified organic material as noted above.

The laser source for both laser drilling of via openings and for the activation of the laser activatable material may be any suitable source that generates laser beams. Examples of the laser source may include a Nd:YAG laser tool or a pulsed ultra-violet (UV) excimer laser, the latter being preferred according to embodiments. The wavelength may be any suitable wavelength for the application, such as Neodymium-doped Yttrium Aluminum Garnet (Nd:YAG, 1064 nm), Xenon Fluoride (XeF, 351 nm), Xenon Chloride (XeCl, 308 nm), Xenon Bromide (XeBr, 282 nm), Krypton Fluoride (KrF, 248 nm), Argon Fluoride (ArF, 193 nm), and Fluoride Dimer (F2, 157 nm), wavelength ranges in the UV or deep UV ranges being preferred according to embodiments. By way of example, to activate the laser activatable film using laser irradiation, according to an embodiment, a laser pulse duration may first be chosen, such as, for example, about 20 ns to about 50 ns for a laser source set at wavelengths including, for example, 193 nm, 248 nm or 308 nm. Once pulse duration is set, the number of pulses to be delivered may be determined as a function of a thickness of the laser activatable film. A rough estimate for determining the number of pulses to be delivered would be based on the thickness to be activated per pulse. For example, with respect to an organic film such as palladium acetate, the activated thickness per pulse ratio would be about 1 micron for a 193 nm, 248 nm or 308 nm laser source. Whether or not "activation" has been achieved may be determined in a number of ways, such as, for example, through a testing process involving measuring a conductivity of respective laser activated portions obtained as a result of corresponding laser irradiation doses. A laser activated portion with a conductivity comparable to that of a metal or of a metal-like conductor would then be considered "activated" according to embodiments, and would set the laser irradiation dose to be delivered for a given laser activatable film thickness and laser activatable material. Alternatively or in conjunction with the above testing method, a composition of each respective laser activated portion may further be determined to ascertain conductivity and hence activation.

To provide the laser activated portions 130', 135', and 136', and non-activated portions 130', of pattern 154, the film-substrate 140 of FIG. 3 may be selectively subjected to laser irradiation according to a predetermined interconnect pattern. According to a preferred embodiment, the selective irradiation according to the predetermined interconnect pattern may be effected for example by laser irradiation of the film of film-substrate combination through a mask, the pattern of which corresponds to the predetermined interconnect pattern. In the alternative, the selective irradiation may be effected by a CAD driven laser direct write. Selective laser irradiation of the laser activatable film according to the predetermined interconnect pattern results in laser activated portions of the film, such as portions 130', corresponding to a predetermined pattern of traces to be provided on the active surface of the substrate, and such as portions 135', and 136', corresponding to a predetermined pattern for a vias by way of via opening 110. Optionally, to provide laser activated tie bar regions 144, the film-substrate combination 140 of FIG. 3 may, according to embodiments, be selectively subjected to laser irradiation according to a predetermined tie bar pattern. As would be recognized by one skilled in the art, the activated tie bar regions would be provided where electrolytic plating on the build up layer is contemplated. The activated tie bar regions would thus allow the provision of tie bars thereon which would in turn provide the necessary electrical interconnections during electrolytic plating, as will be described further below. According to a preferred embodiment, the selective irradiation according to the predetermined tie bar pattern may be effected for example by using laser direct writing on the film of the film-substrate combination, such as a CAD driven laser direct write. Selective laser irradiation of the laser activatable film according to a predetermined tie bar pattern may occur simultaneously with selective laser irradiation of the laser activatable film according to a predetermined interconnect pattern, and results in laser activated tie bar regions of the film, such as regions 144 shown in FIG. 4b.

Referring next to FIGS. 5a and 5b by way of example, laser assisted metallization according to embodiments comprises removing non-activated portions of the partially activated film to yield a patterned-build-up-layer-substrate combination. As shown in the embodiments of FIGS. 5a and 5b, a removal of non-activated portions 130', would result in a patterned-build-up-layer-substrate combination 161 as shown, including substrate portion 102 having exposed surfaces 104, activated tie bar regions 144, and further including a patterned build up layer 162 including the activated portions 130', 135', and 136', and activated tie bar regions. According to a preferred embodiment, removing comprises subjecting the partially activated film to a wash. For example, when the material of the patterned build up layer includes a palladium rich modified organic material obtained through laser activation of a palladium acetate laser activatable film, the wash may comprise a water wash.

Figure 7A:
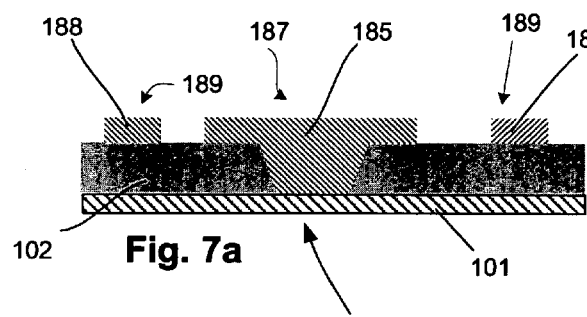
FIGS. 7a and 7b are, respectively, cross sectional and top plan views showing the electrolessly plated substrate of FIGS. 6a and 6b as having been provided with an electrolytically deposited second conductive layer to yield an electrolytically plated substrate according to an embodiment.
Figure 7B:
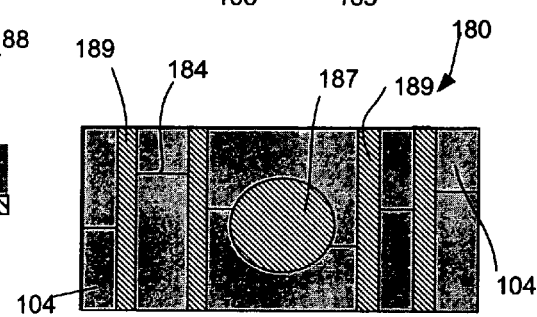
Figure 8:
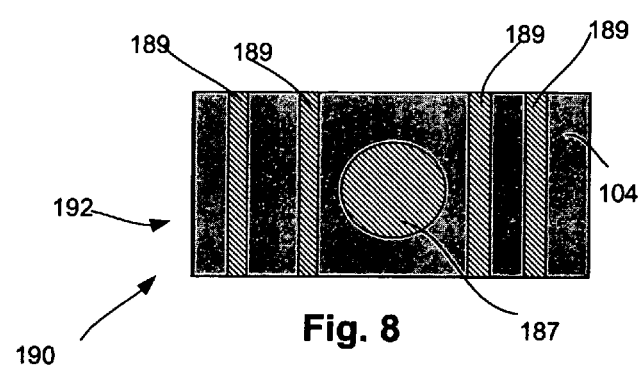
FIG. 8 is a top plan view showing the electrolytically plated substrate of FIGS. 7a and 7b as having had its tie bars removed to yield a patterned substrate or printed circuit board.

Referring next to FIGS. 6a-8 by way of example, laser assisted metallization according to embodiments comprises providing interconnects according to the predetermined interconnect pattern on the patterned-build-up-layer-substrate combination to provide a printed circuit board. By "interconnects," what is meant in the context of the present invention is the combination of conductive traces and vias according to the predetermined interconnect pattern. For example, as seen in FIG. 8, the printed circuit board 190 comprises substrate portion 102 and interconnects 192 provided on the substrate portion 102, the interconnects comprising traces 189 and a via 187 as shown according to the predetermined interconnect pattern. Providing interconnects may be provided according to any well known method using the build up layer 162 as a seed layer. For example, providing interconnects may be effected using solely electroless plating, that is, electroless plating without any further metallization, or using a combination of electroless plating and electrolytic plating. Providing interconnects using a combination of electroless plating and electrolytic plating as mentioned above will now be described in further detail in relation to the example preferred embodiment of FIGS. 6a-8.

Figure 6B:
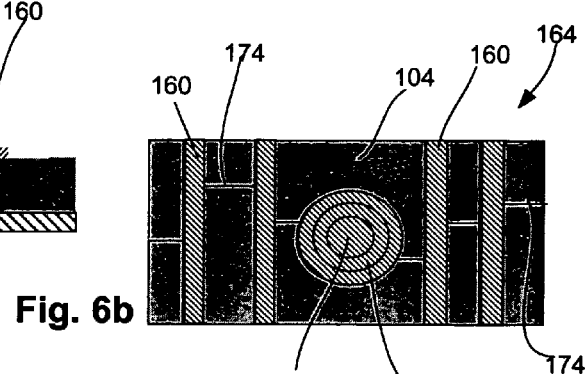

Thus, as seen in FIGS. 6a-6b by way of example, laser assisted metallization according to embodiments comprises providing a first conductive layer on the build-up layer of the patterned-build-up-layer-substrate combination through electroless plating, the first conductive layer defining a seed layer having a pattern corresponding to the pattern of the build up layer, thus providing an electolessly plated substrate, such as electrolessly plated substrate 164 of FIGS. 6a and 6b. It is noted that, as is well know, to the extend that the build-up layer 162 serves as a seed for the further electrolessly plated conductive layer, the build-up layer serves as a site of atomic nucleation for the electrolessly plated conductive layer, and, as a result, no longer exists as a "layer" proper, the atoms thereof having been dispersed after electroless plated. As a result, a build-up layer is not shown in FIGS. 6a-8. It is noted, however, that, to the extent that the build-up layer serves as a site of atomic nucleation, atoms from the build-up layer still remain at least in the electrolessly plated copper layer. As seen in FIGS. 6a and 6b, the electrolessly plated substrate 164 includes substrate portion 102 having exposed regions 104, build up layer 162, and an electrolessly plated first conductive layer including conformal conductive seed layer 168 selectively provided on the build up layer 162. Seed layer 168 includes, in the shown embodiment, seed layer portions 165 and 166, which respectively occupy regions corresponding to the walls and the bottom of via opening 110, seed layer portion 160, which respectively occupy regions corresponding to the traces, and tie bar seed layer portions 174.

Referring next to FIGS. 7a and 7b by way of example, laser assisted metallization according to embodiments comprises providing a second conductive layer on the first conductive layer of the electrolessly plated substrate through electrolytic plating such that the second conductive layer defines a pattern corresponding to the pattern of the first conductive layer and of the build up layer, thus providing an electrolytically plated substrate, such as electrolytically plated substrate 164 of FIGS. 6a and 6b. As seen in FIGS. 6a and 6b, the electrolytically plated substrate 180 includes substrate portion 102 having exposed regions 104, build up layer 162, an electrolessly plated first conductive layer including conformal conductive seed layer 168 selectively provided on the build up layer 162, and an electrolytically plated second conductive layer 182. Second conductive layer includes, in the shown embodiment, second conductive layer portion 185, which defines via 187, second conductive layer portion 188, which defines traces 189, and tie bar portions 183 which define tie bars 184.

Referring next to FIG. 8 by way of example, embodiments of the present invention further comprise removing the tie bars to provide a printed circuit board, such as printed circuit board 190. Thus, as seen in FIG. 8, the printed circuit board comprises traces 189 and a via 187 according to the predetermined interconnect pattern. According to a preferred embodiment, removing the tie bars may comprise laser ablation of the tie bars. By "removing," what is meant in the context of the present invention encompasses both substantially complete removal and trimming, as would be recognized by one skilled in the art. As described above with respect to the example embodiment shown in FIGS. 1-8, embodiments of the present invention propose a process flow for a novel, laser-based substrate manufacturing process hereinafter referred to as LAMP, or laser assisted metallization and patterning. The LAMP technology, as described above, may use laser irradiation to provide via openings, such as by way of drilling, and may selectively metallize an organic material of a build up layer to form a required design circuitry pattern, or predetermined interconnect pattern, without the necessity for any lithographic processing. The laser may be used through laser projection machining, laser assisted metallization and laser direct writing. Laser projection machining may be used to provide via openings using laser ablation, in a well known manner. Laser assisted metallization may be used according to embodiments to activate a laser activatable material on the surface of a substrate according to the predetermined interconnect pattern. Activation of the laser activatable material and removal of any non-activated portions of the laser activatable material results in the formation of patterned a build up layer on the substrate including a conductive material seed element, such as a palladium rich modified organic material as a copper seed layer. Laser direct writing may optionally be used to create a tie bar structure needed for electrolytic plating where electrolytic plating is contemplated. A printed circuit board obtained according to method embodiments comprises a via-defining substrate comprising a microelectronic substrate defining via openings therein; and interconnects provided on the via-defining substrate according to a predetermined interconnect pattern, the interconnects comprising a conductive layer having a pattern corresponding to the predetermined interconnect pattern, the conductive layer further being made substantially from a first material, the conductive layer further comprising a second material different from the first material, the second material including a metallic seeding material and being present on the via-defining substrates only at regions corresponding to the interconnects.

Advantageously, embodiments of the present invention provide a printed circuit board that has an electric circuit firmly attached to the dielectric surface and vias that are electrically connected and suitable for accepting the electronic components that will be mounted thereon. Embodiments of the present invention provide many advantages over the process on record (POR) substrate process such as high resolution, elimination of the multisteps lithographic process, improved alignment capabilities, and eliminate de-smearing. In particular, embodiments of the present invention according to LAMP use laser irradiation both for creating via openings and, in addition, for providing a patterned build up layer having a pattern corresponding to the desired (predetermined) interconnect pattern, thus eliminating the need for lithography with respect to providing the interconnects. The use of LAMP according to embodiments advantageously: (1) eliminates the lithography process, and therefore the need to use dry film resist (DFR) and its associated processes; (2) eliminates the need for a desmear process; (3) provide high resolution patterning and metallization by allowing the patterning and metallization of features sizes in the nanometer range as governed by the wavelength range of the laser source used, such as, for example, a UV wavelength range; (4) provides improved alignment capabilities for both via and interconnect patterning and metallization since (a) eliminates compound effects of having to use both laser irradiation for generation of via openings and lithography for generation of the interconnect pattern; (b) provides a higher imaging alignment than that associated with a contact masking process for lithography; (c) where a UV laser is used as the laser source, provides better alignment when compared with the IR CO2 laser used in prior art processes for laser via-drilling.

With respect to the LET process described in the Background section above, embodiments of the present invention advantageously dispense with a necessity to ablate the substrate on two occasions as described, once to provide the via openings, and again to provide recessed trace locations as described above. In addition, embodiments of the present invention advantageously dispense with a need to etch the substrate in order to provide an interconnect pattern on the substrate, thus significantly improving throughput and meanwhile producing traces that are identical to known non-LET traces, that is, traces disposed substantially at the substrate surface rather than embedded traces. In addition, embodiments of the present invention advantageously dispense with a need to remove excess conductive material from the trace and/or via locations through any means, such as through grinding or through chemical mechanical polishing. Advantageously, embodiments of the present invention result in the introduction of conductive material seeding only in areas corresponding to the predetermined interconnect pattern. Additionally, where the provision of the interconnects according to an embodiment involves solely electroless plating, that is, electroless plating without electrolytic plating, advantageously, significant cost and throughput advantages may be achieved.

Figure 9:
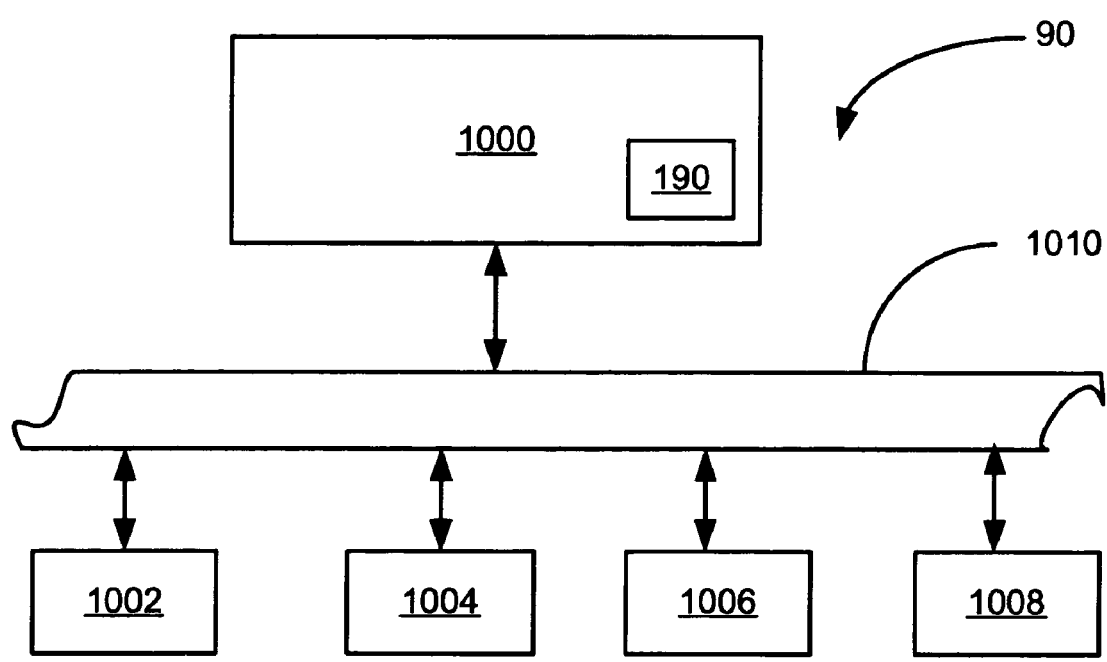
FIG. 9 is a schematic representation of a system incorporating a printed circuit board according to an embodiment.

Referring to FIG. 9, there is illustrated one of many possible systems in which embodiments of the present invention may be used. The shown system 90 therefore comprises an electronic assembly 1000 which includes a printed circuit board such as, for example, printed circuit board 190 of FIG. 8 described above. In an alternate embodiment, the electronic assembly 1000 may include an application specific IC (ASIC). Integrated circuits found in chipsets (e.g., graphics, sound, and control chipsets) may also be packaged in accordance with embodiments of this invention.

For the embodiment depicted by FIG. 9, the system 90 may also include a main memory 1002, a graphics processor 1004, a mass storage device 1006, and/or an input/output module 1008 coupled to each other by way of a bus 1010, as shown. Examples of the memory 1002 include but are not limited to static random access memory (SRAM) and dynamic random access memory (DRAM). Examples of the mass storage device 106 include but are not limited to a hard disk drive, a compact disk drive (CD), a digital versatile disk drive (DVD), and so forth. Examples of the input/output module 1008 include but are not limited to a keyboard, cursor control arrangements, a display, a network interface, and so forth. Examples of the bus 1010 include but are not limited to a peripheral control interface (PCI) bus and Industry Standard Architecture (ISA) bus, and so forth. In various embodiments, the system 90 may be a wireless mobile phone, a personal digital assistant, a pocket PC, a tablet PC, a notebook PC, a desktop computer, a set-top box, a media-center PC, a DVD player, and a server.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A method of providing a printed circuit board comprising:
    providing a microelectronic substrate;
    providing a via-defining substrate by providing via openings in the substrate using laser irradiation;
    providing a laser activatable film on the via-defining substrate; and
    providing interconnects on the via-defining substrate comprising:
        providing a patterned build-up layer on the via-defining substrate comprising exposing the laser activatable film to laser irradiation to selectively activate portions of the film according to a predetermined interconnect pattern;
        removing non-activated portions of the film after exposing; and
        metallizing the patterned build-up layer according to the predetermined interconnect pattern to yield the interconnects to provide the printed circuit board.

2. The method of claim 1, wherein removing comprises subjecting the film to a wash.

3. The method of claim 2, wherein the wash comprises a water wash.

4. The method of claim 1, wherein providing the laser activatable film comprising dip coating the via-defining substrate.

5. The method of claim 1, wherein the laser activatable film comprises palladium acetate.

6. The method of claim 1, wherein the build-up layer comprises a palladium seeded organic build-up layer.

7. The method of claim 1, wherein exposing comprises exposing the laser activatable film to laser irradiation though a mask having a pattern corresponding to the predetermined interconnect pattern.

8. The method of claim 1, wherein providing the patterned build-up layer further comprises exposing the laser activatable film to laser irradiation to selectively activate portions of the film according to a predetermined tie bar pattern to obtain tie bar regions of the build-up layer.

9. The method of claim 1, wherein at least one of providing via openings and providing a patterned build-up layer comprises using a UV laser source.

10. The method of claim 1, wherein metallizing comprises providing a patterned conductive layer on the patterned-build-up-layer-substrate combination according to the predetermined interconnect pattern by electrolessly plating the patterned-build-up-layer-substrate combination to yield an electrolessly plated substrate.

11. The method of claim 8, wherein metallizing comprises providing a patterned conductive layer on the patterned-build-up-layer-substrate combination according to the predetermined interconnect pattern by electrolytically plating the patterned-build-up-layer-substrate combination using the tie bar regions.

12. The method of claim 10, wherein:
    providing the patterned build-up layer further comprises exposing the laser activatable film to laser irradiation to selectively activate portions of the film according to a predetermined tie bar pattern to obtain tie bar regions of the build-up layer;
    the patterned conductive layer is a first patterned conductive layer; and
    metallizing further comprises providing a second patterned conductive layer on the patterned-build-up-layer-substrate combination according to the predetermined interconnect pattern by electrolytically plating the electrolessly plated substrate using the tie bar regions.

13. The method of claim 12, wherein the first conductive layer and the second conductive layer comprise copper.

14. The method of claim 12, further comprising removing the tie bar regions after metallizing.

15. The method of claim 12, wherein removing comprises using laser ablation.

* * * * *